United States Patent [19]
Ohta

[11] Patent Number: 5,223,371
[45] Date of Patent: Jun. 29, 1993

[54] THERMAL DEVELOPING TYPE PHOTOSENSITIVE PRESSURE SENSITIVE IMAGE RECORDING MEDIUM

[75] Inventor: Mitsuru Ohta, Nagaya, Japan

[73] Assignee: Brother Kogyo Kabushiki Kaisha, Nagoya, Japan

[21] Appl. No.: 886,255

[22] Filed: May 21, 1992

[30] Foreign Application Priority Data

May 23, 1991 [JP] Japan ................. 3-149612

[51] Int. Cl.$^5$ ................. G03C 1/72
[52] U.S. Cl. ................. 430/138; 430/200;
430/235; 430/211; 430/252; 430/253; 430/256;
430/262; 430/964
[58] Field of Search ............... 430/138, 200, 203, 211,
430/252, 253, 254, 260, 262, 258, 235, 292, 281,
350, 617, 619, 964, 256; 428/402.21; 503/215

[56] References Cited

U.S. PATENT DOCUMENTS

| | | | |
|---|---|---|---|
| 4,399,209 | 8/1983 | Sanders et al. | 430/138 |
| 4,483,912 | 11/1984 | Sanders | 430/138 |
| 4,758,496 | 7/1988 | Kakimi | 430/138 |
| 4,842,976 | 6/1989 | Sanders et al. | 430/138 |
| 4,948,695 | 8/1990 | Matsushita et al. | 430/138 |

FOREIGN PATENT DOCUMENTS

| | | | |
|---|---|---|---|
| 1216455 | 1/1987 | Canada. | |
| 58-88739 | 5/1983 | Japan. | |
| 59-30537 | 2/1984 | Japan. | |
| 59-137944 | 8/1984 | Japan. | |
| 61-275742 | 12/1986 | Japan. | |
| 61-278848 | 12/1986 | Japan. | |
| 1-216336 | 8/1989 | Japan | 430/631 |
| 2-2030248 | 9/1990 | Japan | 430/138 |
| 2133899 | 8/1984 | United Kingdom. | |

OTHER PUBLICATIONS

English Abstract of Japan Patent 61-275742 Dec. 5, 1986.
English Abstract of Japan Patent 61-278848 Dec. 9, 1986.

*Primary Examiner*—Marion E. McCamish
*Assistant Examiner*—Janis L. Dote
*Attorney, Agent, or Firm*—Oliff & Berridge

[57] ABSTRACT

A thermal developing type photosensitive pressure sensitive recording medium records an image and transfers the image onto an image receiving medium. The image recording medium includes a substrate, microcapsules and binder. The microcapsules are formed on the substrate, and encapsulate therein dye and polymerizable compound. A latent image is formed in a combination of the microcapsules by changing mechanical strength thereof upon photopolymerization of the polymerizable compound for forming cured and non-cured microcapsules. The dye flows out of the non-cured microcapsules and is transferred onto an image receiving layer by rupturing the non-cured microcapsules upon pressure application. The binder fixes the microcapsules onto the substrate. The binder contains a pressure sensitive adhesive agent. A portion of the image receiving layer, which portion being out of the image transferred area is adhesively removed from a base sheet of the image receiving medium and bonded to the image recording medium when the binder is pressed into direct contacted with the image receiving layer. If dye exists between the binder and the image receiving layer, such removal is restrained.

5 Claims, 3 Drawing Sheets

THERMAL DEVELOPING TYPE PHOTOSENSITIVE PRESSURE SENSITIVE IMAGE RECORDING MEDIUM

BACKGROUND OF THE INVENTION

The present invention relates to a photosensitive pressure sensitive image recording medium in which an immense numbers of microcapsules are carried on a substrate, the microcapsules encapsulating therein dye precursor and polymerizable compound, etc. More particularly, the invention relates to a thermal developing type photosensitive pressure sensitive image recording medium in which a latent image is formed in a microcapsules layer by changing mechanical strength of the microcapsules upon photopolymerization, and an output image corresponding to the latent image is formed on an image receiving sheet by transferring the dye precursor etc. thereon by virtue of rupture of the microcapsules upon pressure application.

Conventional photosensitive pressure sensitive image recording medium is described in Japanese Patent Application Kokai (OPI) Nos. 58-88739, 59-30537 and 59-137944, In an image forming techniques described in these publications, at least two components initially separated from each other are reacted with each other because of a change in physical parameters such as pressure change and temperature change. The reaction accompanies optical change in, for example, light absorbing spectrum range and light absorbing intensity. Thus, an image recording operation can be made dependent on the change in the physical parameters.

According to one typical conventional example, a photosensitive pressure sensitive image recording medium is provided in which an immense numbers of microcapsules are carried on a substrate. Mechanical strength or hardness of the microcapsules are changed upon light irradiation. Further, a developer medium is provided in which a developing agent is coated on a base substrate. The microcapsule layer and the developer layer are superposed with each other for pressure developing operation. As a result, microcapsules are selectively ruptured depending on their hardness, so that dye or dye precursor and dye receiver or developing agent are reacted with each other for forming a visible output image on the developer sheet.

Further, a conventional thermal developing type photosensitive pressure sensitive image recording medium is disclosed in Japanese Patent Application Kokai (OPI) Nos. 61-275742 and 61-278848. This type of recording medium has a substrate coated with microcapsules encapsulating therein photosensitive silver halide, reducing agent, polymerizable compound and color former. Image exposure operation is performed with respect to the recording medium, and then the medium is heated so as to provide reaction of the polymerizable compound, to thereby provide difference in mechanical strength among the microcapsules. Next, an image receiving sheet capable of allowing the color former to be easily transferred is superposed with the image recording medium, and these are pressed together for selectively rupturing the microcapsules. As a result, the color former is transferred onto the image receiving medium for obtaining an output color image.

The image receiving medium or sheet must undergo special treatment for receiving the output image thereon. And the receiving medium is formed with an image receiving layer which is a glossy layer for obtaining a glossy output image. However, the gloss surface also has disadvantage in that the output image cannot be easily recognized due to visible light reflection thereat, and further, it would be rather difficult to manually write words or illustrations onto the glossy layer, i.e., writing performance may be degraded if the writing surface has the glossy layer.

SUMMARY OF THE INVENTION

It is therefore, an object of the invention to overcome the above described drawbacks and to provide an improved image recording medium imparted with high visuality with respect to an output image on an image receiving medium and capable of facilitating writing thereon.

That is, the object of the invention is to provide such image recording medium capable of removing a part of the image receiving layer, the part corresponding to an area of the image receiving layer where no output image is transferred or provided. By the removal of the glossy region at the position outside of the imaging area, visuality to the resultant output image can be enhanced, and writability to that portion can be improved.

This and other object of the invention will be attained by providing a thermal developing type photosensitive pressure sensitive recording medium for recording an image and for transferring the image onto an image receiving medium having base layer and an image receiving layer formed thereon, the image recording medium comprising (a) a substrate, (b) microcapsules formed on the substrate, the microcapsules encapsulating therein at least dye and polymerizable compound, a latent image being formed in a combination of the microcapsules by changing mechanical strength thereof upon photopolymerization of the polymerizable compound for forming cured and non-cured microcapsules, and the dye being flowed out of the non-cured microcapsules and being transferable onto the image receiving layer for forming an imaging area by rupturing the non-cured microcapsules upon pressure application, and (c) a binder for fixing the microcapsules onto the substrate, the binder containing a pressure sensitive adhesive agent.

In another aspect of the invention, there is provided a combination of a thermal developing type photosensitive pressure sensitive image recording medium and an image receiving medium, a latent image being formed on the image recording medium, and an output image corresponding to the latent image being formed on the image receiving medium. The image recording medium comprises (a) a substrate, (b) microcapsules formed on the substrate, the microcapsules encapsulating therein at least dye and polymerizable compound, a latent image being formed in a combination of the microcapsules by changing mechanical strength thereof upon photopolymerization of the polymerizable compound for forming cured and non-cured microcapsules for forming the latent image, and (c) a first binder for fixing the microcapsules onto the substrate, the binder containing a pressure sensitive adhesive agent. The image receiving medium comprises (a) a base layer, and (b) an image receiving layer containing therein a second binder, the dye flowed out of the non-cured microcapsules being transferable onto the image receiving medium for forming an imaging area by rupturing the non-cured microcapsules upon pressure application, a binding force of the first binder being greater than that of the second binder for adhesively transferring a non-imaging area of the image receiving layer from the base layer to the image recording medium.

DETAILED DESCRIPTION OF THE PREFERRED EMBODIMENT

Figure 1:
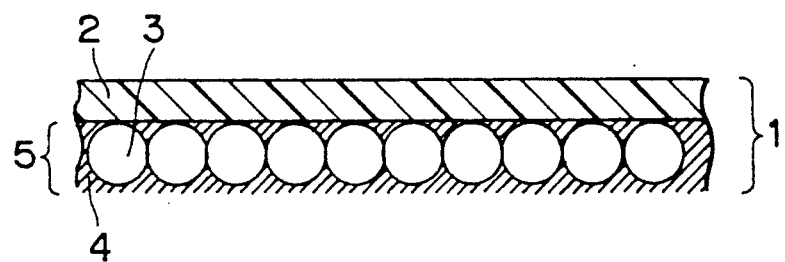
FIG. 1 a schematic cross-sectional view showing a thermal developing type photosensitive pressure sensitive recording medium according to one embodiment of this invention.

A thermal-developing type photosensitive pressure sensitive image recording medium according to one embodiment of this invention will be described with reference to FIG. 1.

The image recording medium 1 includes an elongated substrate 2 and a photosensitive layer 5 formed thereon. The photosensitive layer 5 is formed of microcapsules 3 fixed on the substrate by a binder 4 containing a pressure sensitive adhesive agent. Each of the microcapsules 3 includes an outer shell formed of aldehyde polycondensation resin. The outer shell encapsulates therein silver halide, reducing agent, dye and polymerizable compound.

The substrate 2 is formed of, for example, a paper, a glass, a coated paper, synthetic paper, polyester, polyvinyl acetal, polyethylene terephthalate, polycaronate and polypropyrene. The coated paper includes a paper base and a clay coating layer.

A conventional silver halide known in the photographic technique is available for the encapsulated material. For example, the material is grains of silver chloride, silver bromide, silver iodide, silver chlorobromide and silver chloroiodide. The latter two materials are a mixture of silver chloride and silver bromide or a mixture of silver chloride and silver iodide. For example, 40 g of gelatin and potassium bromide were dissolved in 3,000 ml of water, and after heating the solution to 50° C., a solution obtained by dissolving 34 g of silver nitrate in 200 ml of water was added while agitating the system for 10 minutes. Then, a solution obtained by dissolving 3.3 g of potassium chloride in 100 ml of water was added by taking 2 minutes. In this way, the silver chlorobromide emulsifier can be obtained.

The reducing agent is made of a material such as hydroquinone, catechol, p-aminophenol, etc, such as those being capable of reducing the silver halide or promoting polymerization of the polymerizable compound. By controlling amount and kind of the reducing agent, the polymerization of the polymerizable compound is controllable at a portion where a latent image created by the silver halide is formed.

The type of the polymerizable compound is not subjected to particular limitation, but any known polymerizable compound can be used. However, the polymerizable compound should provide high boiling point with low volatility in a heating step, since the recording medium 1 undergoes thermal development. In this connection, ethylene-unsaturated group such as acrylic acid and salts thereof, methacrylic acid and salts thereof, methacrylic acid ester, maleic anhydride, and vinyl ester is a preferable material.

Thermal polymerization initiator is used for providing a polymerization initiation radical as a result of thermal decomposition at the time of thermal developing operation. The initiator is made of an azo compound such as azobisisobuty-ronitrile and 1,1-azobis(1-cyclohexanecarbonitrile) or inorganic peroxide such as peroxybenzoic acid and D-t-buthl peroxide.

The thermal-developing type photosensitive recording medium includes the substrate 2 and the microcapsules 3 carried thereon, and the binder 4 is used to fix the microcapsules to the substrate 2 as described above. The binder i.e., pressure sensitive adhesive, according to the invention has another effect for peeling off a portion of the image receiving layer 8, the portion being other than portions where the microcapsules are ruptured for image formation. Here, if fixing of the microcapsules on the substrate 2 is only intended, a microcapsule coating liquid containing about 1 to 10% of the binder may be available. However, in order to provide the effect of peeling off the non-imaging zone of the image receiving layer 8, about 5 to 30% of binder must be contained in the coating liquid.

The binder 4 is made of a material which is conventionally used for an adhesive tape. The material is for example ethylene-vinyl acetate copolymer, ethylene ethyl acrylate copolymer and polyvinyl alcohol. Also available are, as the material of the binder, methyl cellulose, carboxymethyl cellulose, hydroxypropyl cellulose, styrenebutadiene latex, polyvinyl acetate, etc. and waxes such as carnauba wax, candelilla wax, paraffin wax, mixrocrystalline wax, amide wax, polyethylene wax and polypropyrene wax. One or more of these binders may be mixed with each other to adjust the adhesive force.

A mixture of the microcapsules and the binder are coated on the substrate 2 by means of a blade, a gravure roll or a roll coater to obtain photosensitive image recording medium 1.

Figure 2:
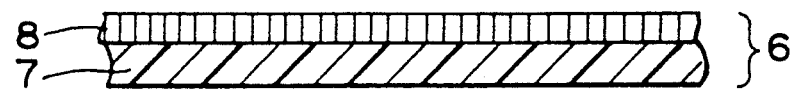
FIG. 2 is a schematic cross-sectional view showing an image receiving sheet or medium.

FIG. 2 shows a cross-sectional view of an image receiving sheet 6 onto which a color image components are to be transferred. The image receiving sheet 6 includes a sheet substrate 7 and an image receiving layer 8 formed thereon. The base substrate 7 of the image receiving sheet is made of a material the same as that of the substrate 2 of the thermal developing type photosensitive pressure-sensitive recording medium. A binder material of the image receiving layer 8 is the same as the binder material which is used in the image recording medium 1. However, the type of binder in the image receiving sheet 6 should be selected such that the adhesive force of the image receiving layer 8 to the substrate 7 is adjusted to be lower than that of the binder used for fixing the microcapsule layer 3 to the substrate 2. Further, the material of the binder in the image receiving sheet 6 may be high molecular weight materials instead of relatively low molecular weight materials which is an adhesive component. Alternatively, mixing amount of the wax should be increased. Thus, adhesion between the microcapsule layer 3 and the image receiving layer 8 may be controllable. In addition to the binder material, also available are a natural product such as gelatin, gelatin derivative and gum arabic and a synthetic polymer such acrylamide polymer as the material of the image receiving layer 8.

The image receiving layer 8 has extremely low surface roughness for providing gloss in order to provide a glossy output image thereon. The image receiving layer 8 may be coated on the base substrate 7 in the same manner as the manner for coating the microcapsules on the substrate 2.

One example for producing the photosensitive recording medium 1 will be described.

Oil drops are dispersed in an aqueous solution containing protective colloid and dispersed as microcapsule core particles in a hydrophobic solution composed of a halogenated silver emulsifier, a polymerizable component, a reducing agent and a given dye component. To this oil drop dispersoid is added a reactive monomer, and the pH and temperature of the resultant system are adjusted to obtain condensation polymer wall formed by a polymerization reaction around the oil drop core material. The microcapsules in aqueous solvent thus obtained are mixed with a binder component also dispersed in aqueous solvent, and the resultant system is coated on the substrate.

An actual example of the manufacture is given below. 50 g of gelatin and 3 g of potassium bromide were dissolved in 3,500 ml of water, and after heating the solution to 50° C. a dispersoid prepared by dispersing 30 g of silver nitrate in 200 ml of water was added by taking a time of 3 minutes, thus obtaining a silver bromide emulsifier. 20 g of this silver bromide emulsifier was added to a solution prepared by dissolving 5 g of oil black in 100 g of 2-ethylhexyl acrylate. The resultant system was rotated 10,000 rotations for 3 minutes to obtain a photosensitive composition. 20 g of the photosensitive composition thus prepared was added to an aqueous solution obtained by adding 50 g of a 3% pectin solution to 10 g of an aqueous solution containing 20% of isobutylene maleic acid anhydride copolymer and adjusting the pH to 4 using an aqueous solution containing 5% of sulfuric acid, and the system was stirred 10,000 rotations for 3 minutes using a homogenizer for emulsification. To the emulsified system were added 10 g of an aqueous solution containing 50% of urea, 3 g of a solution containing 10% of resorcin, 10 g of an aqueous solution containing 40% of formalin and 3 g of a solution containing 10% of ammonium sulfate, and the system was continuously heated at 50° C. while stirring it for 2 hours, thus obtaining a thermal developing type photosensitive pressure-sensitive recording medium constituted by urea-formaldehyde wall formed around the photosensitive composition emulsifier. The microcapsule solution thus obtained was subjected to centrifugal separation, the supernatent liquid was discarged, and excess material other than the microcapsules was washed away by adding 100 g of water.

A microcapsule dispersoid was adjusted by adding 50 g of an aqueous solution containing 5% of polyvinyl alcohol and 30 g of an aqueous solution containing 15% of ethylenevinyl acetate to 10 g of microcapsule solid part, thus obtaining a microcapsule dispersoid. The microcapsule dispersoid was coated on 50 μm thick polyethylene telephthalate substrate using a coating bar, thus providing the thermal developing type photosensitive pressure sensitive image recording medium.

For production of the image receiving sheet, to 100 g of water were added 5 g of an aqueous solution containing 0.4% of sodium metaphosphate, 80 g of calcium carbide and 30 g of 5% polyvinyl alcohol, and the system was coated on a polyethylene telephthalate substrate.

Figure 3:
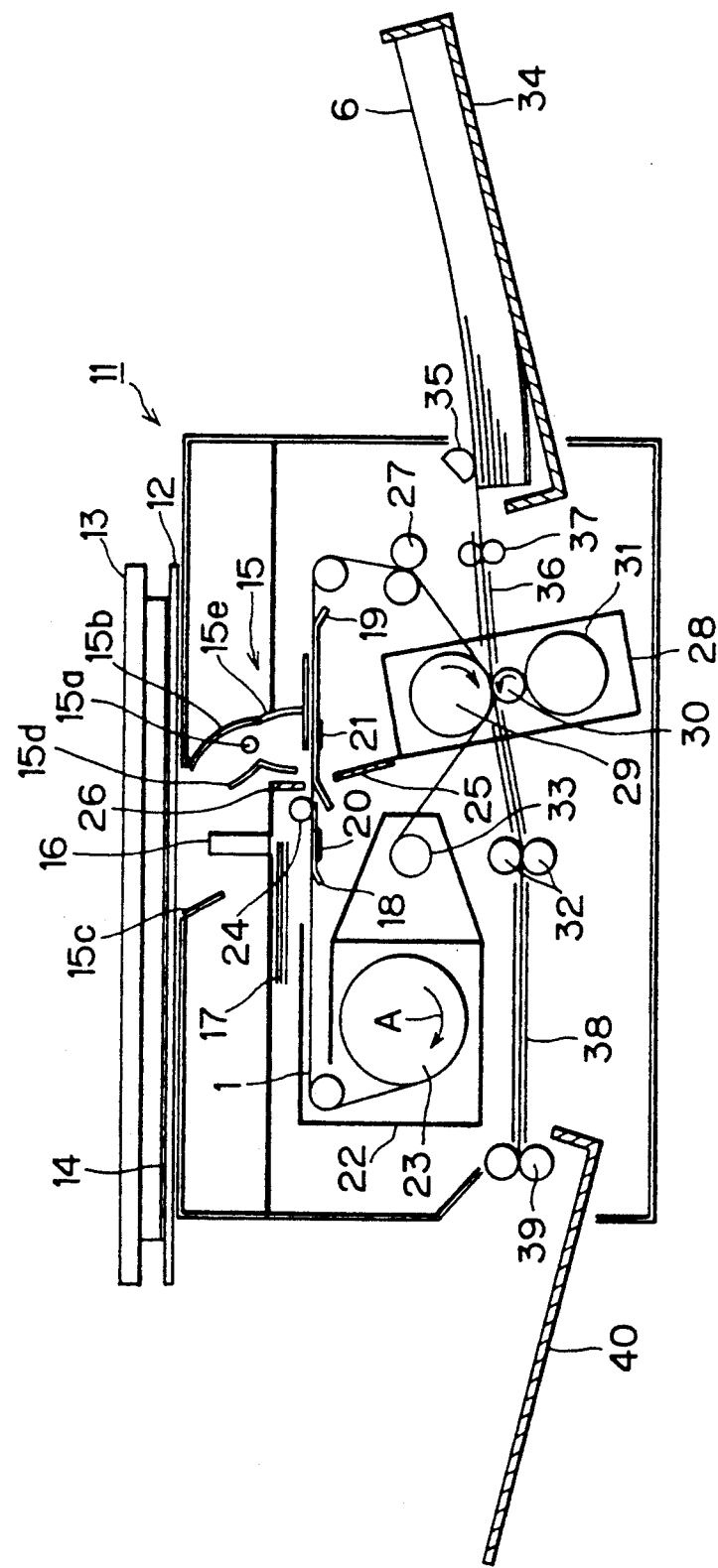
FIG. 3 is a schematic cross-sectional view showing an image recording apparatus which employs the image recording and receiving mediums such as those shown in FIGS. 1 and 2.

Next, an image recording apparatus 11 using the image recording medium 1 shown in FIG. 1 will be described with reference to FIG. 3.

The recording apparatus 11 includes a transparent original support glass 12 on which an original 14 is mounted. An original cover member 13 is pivotably disposed above the original support glass 12 for covering the original 14 on the glass 12. The original support glass 12 is reciprocally movable in a longitudinal direction together with the original cover member 13.

At a position below the original support glass 12, a light heat source portion 15 is disposed. The light heat source 15 includes a halogen lamp 15a, reflectors 15b, 15c, an infrared radiation transmitting mirror 15d and an infrared radiation reflecting mirror 15e. The light heat source 15 is adapted for irradiating line-light onto the original support glass 12 in a direction perpendicular to the moving direction thereof. The thus irradiated light is transmitted through the transparent original support glass 12 and is reflected at the original 14. The reflected light is directed downwardly.

A self-focussing lens 16 is disposed immediately below the original support glass 12, and a color conversion filter 17 is disposed below the self-focussing lens 16. Further, an exposure stand 18 for supporting the photosensitive pressure sensitive thermal developing type image recording medium 1 in its plane fashion is disposed below the color conversion filter 17. At a rear surface of the exposure stand 18, a first heating unit 20 is provided for uniformly heating the exposure stand 18. At a position beside the exposure stand 18, a heating stand 19 is provided. At a rear surface of the heating stand 19, a second heating unit 21 is provided which is operated during thermal developing operation. The exposure stand 18 and the heating stand 19 also serve as a guide for providing a flat or linear orientation of the image recording medium 1 during its transfer. The light reflected from the original 14 is entered into the self-focussing lens 16, and the light carrying an imaging information is focussed onto the image recording medium 1 positioned on the exposure stand 18.

At a central portion of the apparatus 11, a cartridge 22 is provided. The cartridge 22 is detachable from a frame of the recording apparatus. The cartridge 22 has a cartridge shaft 23 around which the elongated image recording medium 1 is rolledly wound. A pull-out roller 24 is disposed above the exposure stand 18 for pulling-out a leading end portion of the rolled image recording medium 1 from the cartridge 22 toward the exposure stand 18 in a direction indicated by an arrow A in FIG. 3 when the cartridge 22 is assembled at a given position. To this effect, a leader film portion is provided at the leading end portion of the image recording medium 1, the pull-out roller 24 being contactable with the leader film portion.

Adiabatic members 25 and 26 are provided at immediately downstream side of the pull-out roller 24 when viewing in the traveling direction of the image recording medium 1. The adiabatic members 25 and 26 are disposed above and below the image recording medium 1, respectively. Therefore, The adiabatic members 25, 26 prevent heat from the first and second heating units 20 and 21 from being transmitted to the rolled image recording medium 1 stored in the cartridge 22.

At a position below the exposure stand 18, a transfer roller 27 and a pressure unit 28 are provided. the transfer roller 27 is adapted for running the elongated image recording medium 1 in the direction A. The pressure unit 28 is adapted for rupturing non-photocured microcapsules 3 in order to flow out the encapsulated dye and polymerizable compound and to transfer these onto the image receiving sheet 6. The pressure unit 28 includes a large diameter roller 29, a small diameter roller 30 in rolling contact therewith and a back-up roller 31 in rolling contact with the small diameter roller 30. Distance between the large and small diameter rollers 29 and 30 can be controlled for controlling nipping pressure and for moving at least one of the rollers 29, 20 away from each other.

At a downstream side of the pressure unit 28, a pair of feed rollers 32 are provided. Further, in the cartridge 22, a takeup roller 33 is rotatably supported for taking-up the exposed and developed image recording medium 1. At an outer peripheral surface of the takeup roller 33, a dual sided adhesion tape (not shown) is adhered for adhesively fixing the leader film portion to the takeup roller 33. Thus, the image recording medium 1 supplied from an upper portion of the cartridge 22 is initially pulled out by the pull-out roller 24, and travels through and above the exposure stand 18 and the heating stand 19, through the transfer roller 27, the pressure unit 28 and reaches the takeup roller 33.

At one side and lower portion of the machine frame, a sheet cassette 34 is detachably provided in which are stored cut image receiving sheets 6. A sector roller 35 is provided immediately above the sheet cassette 34 for feeding each one of the image receiving sheet 6 toward the pressure unit 28. A sheet supply roller 37 is provided between the sheet cassette 34 and the pressure unit 28 for delivering the thus fed cut image receiving sheet 6 to the pressure unit 28 along a sheet guide 36 bridging between the cassette 34 and the pressure unit 28. Incidentally, a light shield cover (not shown) is provided for avoiding light irradiation onto a non-exposed area of the image recording medium 1 which has been just pulled out of the cartridge 22.

Discharge rollers 39 are provided at another side of the machine frame, and a discharge guide 38 is provided between the discharge rollers 39 and the feed rollers 32. Further, a discharge tray 40 is positioned adjacent the discharge rollers 39. Thus, the image receiving sheet 6 on which an image is transferred passes through the feed rollers 32, runs along the discharge guide 38 and is discharged onto the discharge tray 40 through the discharge rollers 39.

In operation, if the cartridge 22 is assembled into the machine frame, automatic loading operation for loading the image recording medium at its path is initiated. That is, the pull-out roller 24 is brought into contact with the leader film portion of the image recording medium 1 only at the starting phase of the automatic loading. The pull-out roller 24 is rotated until the leader film portion reaches the transfer roller 27. Thereafter, the pull-out roller 24 is moved away from the leader film portion and the rotation of the pull-out roller 24 is stopped. Subsequent transferring operation of the image recording medium 1 is imparted by the transfer roller 27. Then, the leader film portion is moved past the pressure unit 28, and is wound over the takeup roller 33 upon adhesion to the dual sided adhesive tape. The image recording medium 1 following the leader film portion is then wound over the takeup roller 33, whereupon copying operation can be started.

When a copy start key (not shown) is depressed, the original support glass 12 is moved to its original position (leftmost side in FIG. 3), and then the halogen lamp 15a is turned on, and the original support glass 12 is moved in one direction (rightwardly in FIG. 3) for starting scanning. Simultaneously the image recording medium 1 is also moved in the direction on and along the exposure stand 18. The light reflected from the original 14 is passed through the self-focussing lens 16 for providing a focussed image on the image recording medium 1, and is passed through the color conversion filter 17 for color correction. Thus, an erect image is provided on the image recording medium 1 on the exposure stand 18.

Since the moving velocity of the image recording medium 1 is synchronized with the moving velocity of the original support glass 12, a line latent image core is successively formed on the image recording medium 1 when it is passed over the exposure stand 18. In this case, the exposure stand 18 is heated to have a predetermined temperature ranging from 20° C. to 150° C. by the first heating unit 20. Therefore, the image recording medium 1 is uniformly heated during contact period with the exposure stand 18. The thus heated zone of the medium 1 is then transferred onto the heating stand 19.

The infrared rays irradiated from the halogen lamp 15a directly reaches the recording medium 1 or is reflectingly reaches the medium 1 through the reflection mirror 15e or through the transmission mirror 15d. Therefore, the recording medium 1 is heated by the infrared rays as well as by the second heating unit 21. Accordingly, the microcapsules on the recording medium 1 are thermally developed. That is, photocuring initiated upon light exposure can be promoted by the heat application. The thus heated image recording medium 1 is transferred to the pressure unit 28 by way of the transfer roller 27.

In the pressure unit 28, the image recording medium 1 and the image receiving sheet 6 fed by the feed roller 36 are superposed with each other in such a manner that a leading end portion of a latent image created in the image recording medium is aligned with the image receiving sheet 6. In the superposed state, the latent image surface or the microcapsule layer 3 of the recording medium 1 is in intimate surface contact with the image receiving layer 8 of the image receiving sheet 6. These sheets 1 and 6 are nipped and pressed by the large and small diameter rollers 29 and 30. Because of the pressure application, non-cured microcapsules which have been unexposed to light at the exposure stand 18 are ruptured, so that the dye in the microcapsules 3 are flowed out of the microcapsules 3 and are transferred onto the image receiving layer 8. On the other hand, since the exposed microcapsules are cured, these are not ruptured even upon the pressure. Therefore, the binder 4 on the photocured microcapsules 3 will peel off the confronting area of the image receiving layer from the base substrate 7. That is, the confronting area of the image receiving layer is transferred onto the binder layer of the image recording medium 1.

Figure 4:
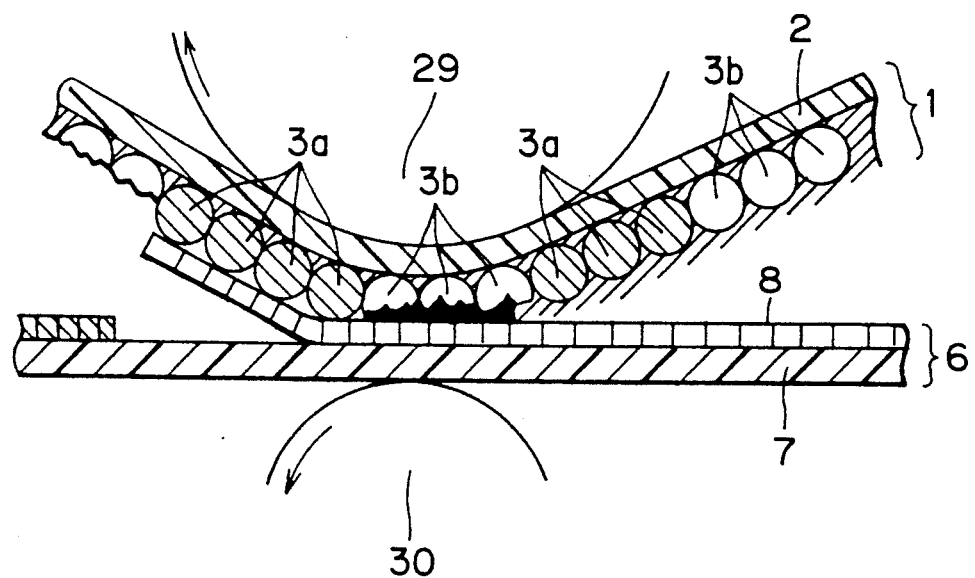
FIG. 4 is a schematic cross-sectional view showing image transferring mechanism according to the embodiment of this invention.

FIG. 4 best shows the image transferring mechanism. With respect to the exposed microcapsules 3 on the substrate 2, the silver halide is reacted with the reducing agent, and radicals are generated upon heating for reaction with the polymerizable compound. Thus, mechanical strength of the microcapsules 3a are increased as a result of photocuring. Therefore, the microcapsules fed to the pressure unit 28 are the mixture of the cured microcapsules 3a and non-cured microcapsules 3b.

At the pressure unit 28, these microcapsules are subjected to pressing while the layer of these microcapsules 3 are in surface contact with the image receiving layer 8. Upon pressurization, the cured microcapsules are not ruptured so that internal polymerizable compound dispersing the dye are remained in the microcapsules 3a. Thus, the binder 4 which is also carried on the substrate 2 is brought into adhesion to the image receiving layer 8, and the adhered area of the image receiving layer 8 is peeled off from the base substrate 7 of the image receiving sheet 6, since adhesive force between the binder 4 and the substrate 2 and adhesive force between the binder 4 and the image receiving layer 8 is higher than that between the image receiving layer 8 and the base substrate 7.

On the other hand, since the unexposed microcapsules 3b are not cured, these are ruptured so that the encapsulated polymerizable compound and the dye are flowed over the image receiving layer 8. The flowed materials reduces adhesive power of the binder 4, and therefore, an area of the image receiving layer on which the image is transferred is not peeled off from the base substrate 7. Consequently, an output image is formed on the image receiving sheet 6. In a resultant image receiving sheet, a non-imaging portion does not provide a gloss, since the image receiving layer at this portion is removed by the binder 4. In other words, in the non-imaging area, a surface of the base substrate 7 is exposed. Accordingly, the non-imaging area provides an inherently rough surface to the base substrate 7 for facilitating writing thereon. Further, since the rough surface does not provide gloss, the final output image can provide sufficiently clear visuality. In other words, the photosensitive recording medium has the pressure sensitive adhesive to peel off the image receiving layer which is coated on the image receiving substrate with a weak force. However, in the portions where microcapsules were ruptured and content thereof was discharged, the pressure sensitive adhesive does not directly contact the image receiving layer. Thus, the image receiving layer is not peeled off from the substrate 7 by the pressure sensitive adhesive formed on the photosensitive recording medium. Image forming dye is absorbed in the image receiving layer existing on the substrate 7.

It should be understood that the effect of the binder 4 is not restricted to the thermal-developing type photosensitive pressure sensitive image recording medium depicted in the illustrated embodiment, but is available for another image recording medium which carries microcapsules in conjunction with the image receiving sheet 6.

While the invention has been described in detail and with reference to specific embodiment thereof, it would be apparent to those skilled in the art that various changes and modifications may be made therein without departing from the spirit and scope of the invention.

What is claimed is:

1. A photosensitive pressure sensitive recording medium for recording an image and for transferring the image onto an image receiving medium having a base layer and an image receiving layer formed thereon, the image recording medium comprising:
   a substrate;
   microcapsules formed on the substrate, the microcapsules encapsulating therein at least dye and a polymerizable compound, a latent image being formed in a combination of the microcapsules by changing mechanical strength thereof upon photopolymerization of the polymerizable compound for forming cured and non-cured microcapsules, and the dye flowing out of the non-cured microcapsules when the non-cured microcapsules are ruptured by pressure application and being transferable onto the image receiving layer for forming an image area;
   a binder for fixing the microcapsules onto the substrate, the binder containing a pressure sensitive adhesive agent; and
   wherein adhesive power between the binder and the substrate and between the binder and the image receiving layer is greater than adhesive power between the image receiving layer and a base layer for adhesively removing a portion of the image receiving layer from the base layer, the portion being offset from the imaging area of the image receiving layer.

2. The image recording medium as claimed in claim 1, wherein the adhesive agent is made of at least one material selected from the group consisting of ethylene-vinyl acetate copolymer, ethylene ethyl acrylate copolymer, polyvinyl alcohol, methyl cellulose, carboxymethyl cellulose, hydroxypropyl cellulose, styrene-butadiene latex, polyvinyl acetate and a wax.

3. The image recording medium as claimed in claim 2, wherein the wax comprises at least one of carnauba wax, candelilla wax, paraffin wax, microcrystalline wax, amide wax, polyethylene wax and polypropyrene wax.

4. The image recording medium as claimed in claim 3, wherein the microcapsules further encapsulate therein silver halide and reducing agent.

5. A combination of a photosensitive pressure sensitive image recording medium and an image receiving medium, a latent image being formed on the image recording medium, and an output image corresponding to the latent image being formed on the image receiving medium; the image recording medium comprising:
   a substrate;
   microcapsules formed on the substrate, the microcapsules encapsulating therein at least dye and a polymerizable compound, a latent image being formed in a combination of the microcapsules by changing mechanical strength thereof upon photopolymerization of the polymerizable compound for forming cured and non-cured microcapsules for forming the latent image; and
   a first binder for fixing the microcapsules onto the substrate, the binder containing a pressure sensitive adhesive agent; and
   the image receiving medium comprising:
   a base layer; and
   an image receiving layer containing therein a second binder, the dye flowing out of the non-cured microcapsules when the non-cured microcapsules are ruptured by pressure application and being transferable onto the image receiving medium for forming an imaging area, a binding force of the first binder being greater than that of the second binder for adhesively transferring a non-imaging area of the image receiving layer from the base layer to the image recording medium.

* * * * *